US005462685A

United States Patent [19]

Raj et al.

[11] Patent Number: 5,462,685

[45] Date of Patent: Oct. 31, 1995

[54] FERROFLUID-COOLED ELECTROMAGNETIC DEVICE AND IMPROVED COOLING METHOD

[75] Inventors: Kuldip Raj, Merrimac; Ronald Moskowitz, Hollis, both of N.H.

[73] Assignee: Ferrofluidics Corporation, Nashua, N.H.

[21] Appl. No.: 166,688

[22] Filed: Dec. 14, 1993

[51] Int. Cl.$^6$ .................... H01F 1/44; H05K 5/00

[52] U.S. Cl. .................... 252/62.56; 252/62.52; 252/62.51; 252/62.55; 361/699; 174/15.1; 174/17 LF; 336/58; 336/94

[58] Field of Search .................... 252/62.52, 62.51, 252/62.56, 62.55; 361/698, 699; 174/15.1, 17 LF; 336/58, 94

[56] References Cited

U.S. PATENT DOCUMENTS

| | | | |
|---|---|---|---|
| 3,316,178 | 4/1967 | Millington | 174/15.1 |
| 4,094,804 | 6/1978 | Shimoiizaka | 252/62.52 |
| 4,788,867 | 12/1988 | Kishel | 73/722 |
| 5,248,861 | 9/1993 | Kato et al. | 200/61.45 M |
| 5,382,373 | 1/1995 | Carlson et al. | 252/62.55 |

OTHER PUBLICATIONS

T. Atarashi et al., 85 *Journal of Magnetism and Magnetic* Materials 203 (1990) (month unknown).

E. Blums et al., *Thermomagnetic Properties of Ferrofluids Containing Chemically Coprecipitated Mn–Zn Ferrite Particles* (date unknown).

Excerpt from S. W. Charles and J. Popplewell, *Ferromagnetic Liquids* (Date Unknown).

*Primary Examiner*—Prince Willis, Jr.
*Assistant Examiner*—Alan D. Diamond
*Attorney, Agent, or Firm*—Bookstein & Kudirka

[57] ABSTRACT

A convection-cooled electromagnetic device, such as a transformer, and methods of cooling that utilize a ferrofluid as a cooling medium. The device's leakage magnetic field, which can be augmented by auxiliary magnets, draws the ferrofluid toward the device. As the fluid approaches the device its temperature rises, resulting in loss of magnetic properties and a decrease in density. The ferrofluid rises as its temperature approaches the Curie point, since the gravitational effect of density reduction begins to overcome the weakening magnetic attraction. Movement of hot ferrofluid is strongly assisted by the attraction exerted by the device on cooler, more intensely magnetic ferrofluid, which displaces the hot ferrofluid. The displaced ferrofluid cools as a result of movement from the heat source and through contact with the walls of the housing. Preferably, the Curie temperature of the ferrofluid is close to or slightly higher than the operating temperature of the device.

24 Claims, 2 Drawing Sheets

FERROFLUID-COOLED ELECTROMAGNETIC DEVICE AND IMPROVED COOLING METHOD

BACKGROUND OF THE INVENTION

1. Field of the Invention

The present invention relates generally to high-power electromagnetic devices, and more particularly to an integral convection cooling system for improving the efficiency of such devices during operation.

2. Description of the Related Art

Inductors represent a large class of electromagnetic devices. The simplest inductor, a solenoid, is merely a coil of wire, ordinarily wound around a core material. Current flowing through the wire creates a magnetic field within the core; when a voltage is applied across the inductor, the magnetic field causes the current to rise as a ramp, the slope of which depends on the strength, or inductance, of the device. Single-coil inductors are used, for example, in many RF and tuned circuits.

The core of an inductor may be no more than a hollow tube. However, winding the wire around a magnetic material augments the magnetic field within the inductor, and therefore multiplies the inductance of the coil by the material's magnetic permeability.

Closely coupling two coils results in a transformer. An AC voltage applied to a first, or primary coil appears across the other, or secondary coil at an altered level determined by the ratio of wire turns in the primary and secondary coils. In transformers, the coils are frequently wound around different portions of the same core, resulting in maximum coupling between the windings. Transformers are used to change an input voltage value to a different value for use in a particular application, and also serve to isolate electronic devices from their power sources.

Electricity supplied over long distances must ordinarily be provided at high voltage levels due to power losses in transmission. Large power transformers situated near delivery points are utilized to bring the voltage down to standard line levels. These transformers operate at very high power levels, typically in the megawatt range. The performance of such devices is necessarily limited by the temperature rise they experience, as well as by the magnetic saturation of the core. A typical high-voltage power transformer exhibits a maximum temperature tolerance of 110° C., and a maximum core saturation value of 20,000 Gauss.

Transformers generate heat through energy losses. A portion of input power is inevitably dissipated in the core, the windings, and the dielectric materials that insulate the windings, increasing the temperature of the transformer's environment. This, in turn, results in elevated resistance within the windings (which are generally copper), increased hysteresis losses within the core, decreased saturation magnetization of the core, and degradation of the transformer's insulation. Ultimately, these factors can lead to significant and permanent efficiency reductions.

To inhibit excessive temperature rise, high-voltage power transformers are usually cooled by surrounding them with oil. The final, steady-state temperature of the transformer reflects an equilibrium between power losses and the heat-dissipation properties of the oil. As the oil is heated it experiences a decrease in density; accordingly, oil in contact with the transformer coils absorbs the greatest amount of heat and, as a result, becomes least dense and rises relative to the surrounding oil. As the rising oil makes contact with the walls of the housing it transfers heat thereto (and, ultimately, with the transformer's exterior environment), cooling and increasing in density. The cooled oil travels toward the bottom of the container, replacing heated oil rising from the windings. This natural convection, caused by the interplay of gravity and heat-induced density variations, represents the cooling mechanism most commonly utilized in commercial high-voltage power transformers.

Unfortunately, the gravitational forces that circulate the oil are relatively weak. Temperature gradients across oil reservoirs are often observed to be quite large, signifying relatively poor heat transfer. Transformer windings frequently develop "hot spots"—regions of intense heating due to ineffective cooling—that can cause insulation to quickly break down.

To improve the efficiency of heat dissipation, transformers are frequently equipped with cooling fixtures (e.g., fins) on the outside of the transformer housing, and occasionally with pumping devices to circulate the oil within the housing. However, because oil pumps are cumbersome, consume power and require maintenance, they are not typically employed.

DESCRIPTION OF THE INVENTION

Brief Summary of the Invention

The present invention utilizes magnetic fluids, sometimes referred to as "ferrofluids," as a cooling medium to enhance significantly the convection process described above. A ferrofluid is a colloid that contains suspended magnetic particles, and which responds to an applied magnetic field as if the fluid itself possessed magnetic characteristics. The magnetization of a ferrofluid is temperature-dependent, decreasing steadily until the fluid reaches a characteristic "Curie temperature" at which point it loses all magnetic strength. The present invention utilizes ferrofluids whose magnetic properties are strongly influenced by temperature, and exploits the fact that the source of greatest heat in a transformer also produces a strong magnetic field.

Specifically, a magnetic field ordinarily surrounds the windings and core of an electromagnetic device such as an inductor or transformer. This "leakage" field occurs as a result of electrical currents in the windings, and reflects imperfect channeling of the magnetic flux into the core; its strength is greatest in the immediate vicinity of the windings and core, and falls off rapidly with increasing distance. In accordance with the present invention, an electromagnetic device is immersed in a ferrofluid, and the magnetic field gradient draws the ferrofluid toward the device; however, because the device generates heat, the temperature of the fluid rises as it approaches the device, resulting in loss of magnetic properties and a decrease in density. The ferrofluid rises as the gravitational effect of density reduction begins to overcome the weakening magnetic attraction. Movement of hot ferrofluid is assisted by the attraction exerted by the electromagnetic device on cooler, more intensely magnetic ferrofluid, which displaces the hot rising ferrofluid as it travels toward the device. Movement away from the heat source and contact with the walls of the housing causes the hot ferrofluid to cool and reacquire magnetization. This convection cycle, driven by magnetic and gravitational forces, involves much faster fluid flows and therefore greater cooling effects than are achieved with ordinary systems.

The per-degree decrease in magnetic strength of a ferrofluid is greatest as the temperature approaches the Curie point. Thus, choosing a ferrofluid whose Curie temperature is close to the device's characteristic operating temperature (typically 70°–300° C.) results in the strongest convection, since the drop in the ferrofluid's magnetization with increasing proximity to the device will be at or close to its maximum. By contrast, ferrofluids with Curie temperatures well in excess of the device's operating temperature experience a much smaller decrease in magnetization as they approach the device, and therefore do not materially enhance the convection process; such materials are generally not suitable for use with the present invention.

Our approach results in efficiency increases due to enhanced cooling (and consequent reduction in average operating temperature), as well as elimination of "hot spots" in the windings that might otherwise result in malfunction or shortened device life.

BRIEF DESCRIPTION OF THE DRAWINGS

The foregoing discussion will be understood more readily from the following detailed description of the invention, when taken in conjunction with the accompanying drawings, in which.

DETAILED DESCRIPTION OF THE PREFERRED EMBODIMENTS

Figure 1:
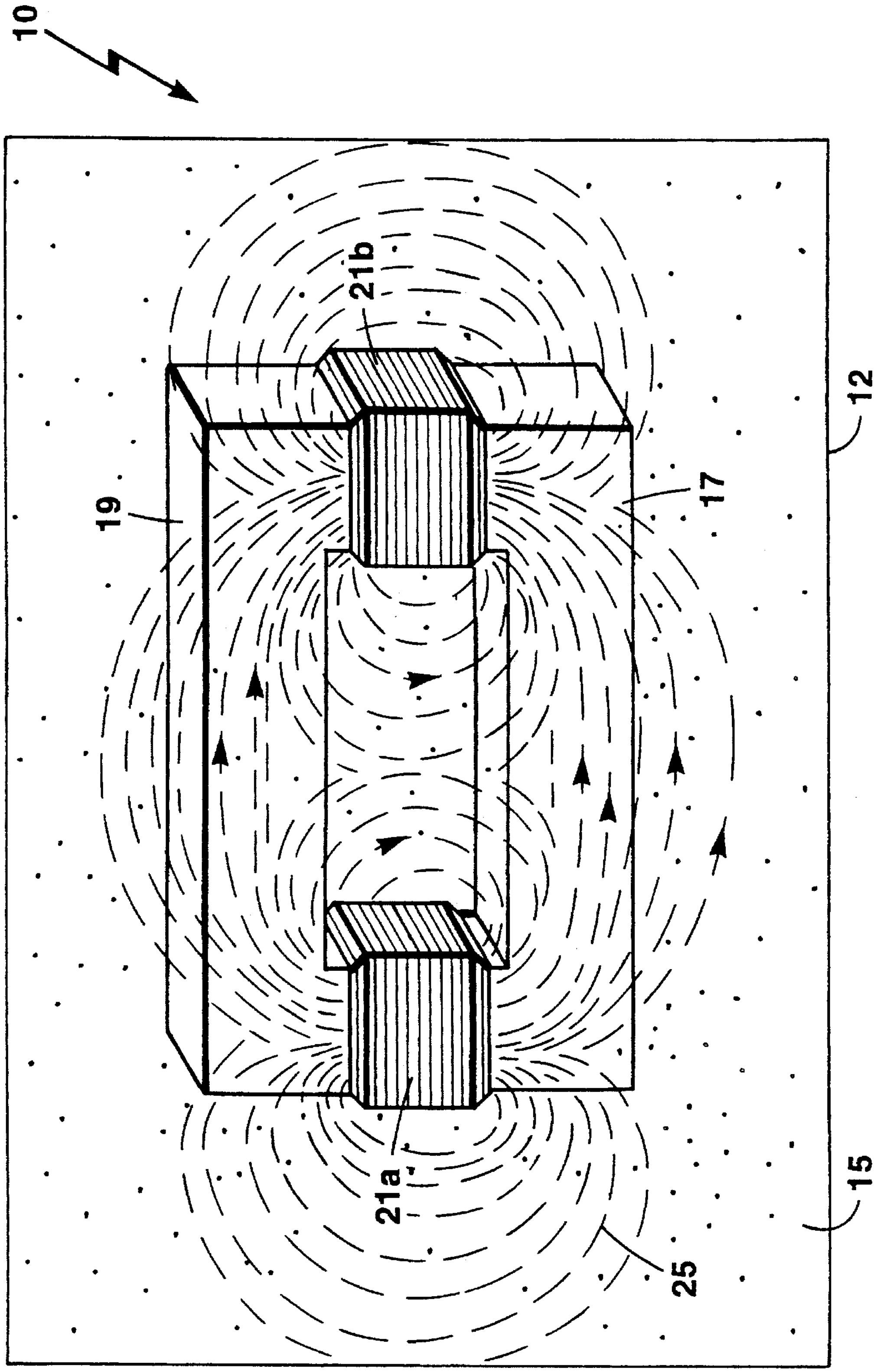
FIG. 1 is a schematic illustration of a transformer embodiment of the present invention.

Ferrites are a class of ferrimagnetic materials represented by the general formula $M^{2+}OFe^{3+}O_3$, where M is a divalent ion of a transition metal such as iron, cobalt, nickel, manganese, copper or zinc. A range of magnetic properties can be obtained through the choice of M, which may be a single metal species or a combination of two or more species. The variable properties include Curie temperature and saturation magnetization, defined as the maximum attainable magnetic moment per unit volume of material.

Ferrite particles can be used to create ferrofluids. See, e.g., U.S. Pat. No. 4,094,804 (water-based magnetic liquids using ferrite particles); Blums et al., "Thermomagnetic Properties of Ferrofluids Containing Chemically Coprecipitated Mn-Zn Ferrite Particles," Intermag Conference '93 (Paper FP07) (oleic-acid-stabilized mixed ferrite $Mn_4Zn_{1-x}Fe_2O_4$ colloids).

Most substituted ferrites tend to have Curie temperatures too high for practical use in the present invention. However, many mixed ferrites exhibit Curie temperatures in the range of 100°–200° C. In addition, some orthoferrites and rare-earth garnets have acceptably low Curie temperatures. Preferred ferrite particles for use with the present invention include:

| Material | Curie Temperature (°C.) |
|---|---|
| $Mn_{0.50}Zn_{0.50}OFe_2O_3$ | 150 |
| $Ni_{0.3}Zn_{0.7}OFe_2O_3$ | 130 |
| $Ni_{0.2}Zn_{0.6}Fe_{2.2}O_4$ | 145 |
| $Zn_{0.6}Co_{0.5}Fe_{1.9}O_4$ | 115 |
| $Mg_{0.5}Zn_{0.5}OFe_2O_3$ | 120 |
| $MnFe_2O_4$ | 300 |

-continued

| Material | Curie Temperature (°C.) |
|---|---|
| $Mn_{0.65}Zn_{0.35}OFe_2O_3$ | 150 |

The magnetic properties of the particulate material are chosen such that the material undergoes a substantial drop in magnetization as it approaches the ordinary working temperature of the device to be cooled. As a practical matter, this ordinarily means that the device's operating temperature is close to or just below the Curie temperature of the chosen material. A Curie temperature well above or below the device operating temperature will fail to perform in the context of the present invention. In the former case the fluid will not be significantly affected by the device's magnetic field, while in the latter case the fluid will lose its magnetization well before it reaches the core, preventing exploitation of the magnetic convection cycle.

In general, magnetic materials suitable for use with high-power transformers have Curie temperatures that range from 70° C. to 300° C. Preferred average particle sizes range from 50 to 200 Å, with an average size of 100 Å, being particularly preferred in order to impart a high overall magnetic susceptibility (i.e., degree of magnetization acquired in response to an applied magnetic field) to the fluid.

The particles are dispersed in a carrier material having high thermal stability (i.e., one that is capable of withstanding the device's operating temperature for long periods without significant degradation); a low dielectric constant, preferably below 3, to sustain an electric field with minimum power dissipation; a high resistivity level, preferably at least $10^{10}$ ohm-meters, to minimize energy loss via charge carriers; and which is preferably substantially free of ions. Many oils, including the cooling oils used in existing high-power transformers, satisfy these requirements; the present invention can therefore be implemented on existing high-power transformers by dispersing a sufficient quantity of selected magnetic particles within the existing oil reservoir. Especially preferred classes of oil for use with the present invention include various forms of petroleum, particularly those of relatively high molecular weight; synthetic hydrocarbons; silahydrocarbons; perfluoropolyethers; chlorofluorocarbons; and silicones.

To promote uniform colloidal separation of particles, a surfactant is desirably added to the ferrofluid, or coated on the particles prior to their addition to the carrier fluid. The surfactant may be anionic (with a negatively charged head group such as a long-chain fatty acid, a succinate, a phosphate or a sulfonate) or cationic (with a positively charged head group such as a protonated long-chain amine, a quaternary-ammonium compound) or nonionic (with an uncharged polar head group such as an alcohol). Suitable examples of such surfactants are well-known to those skilled in the art.

The optimal particle concentration or loading level depends on several factors. The preferred saturation magnetization of the ferrofluid ranges from 50 to 600 Gauss, and its viscosity should range from 10 to 500 centipoises (measured at 27° C.); these limits place inherent restrictions on the amount of particulate material that can be suspended. While high saturation magnetization produces strong magnetically induced circulation flows, excessive viscosities work to impede those flows. As a result, the optimal particulate loading level balances these two competing factors to produce the highest obtainable convection, and varies with the particular application; those skilled in the art can readily determine the best concentration in a given instance.

Finished ferrofluids may have dielectric constants and resistivity values different (but not substantially) from the carrier oil in isolation. Preferred ferrofluids have dieletric constants less than 4 and resistivities in excess of $10^7$ ohm-meters.

A representative embodiment of the invention is depicted schematically in FIG. 1. As shown therein a transformer assembly, denoted generally by reference numeral 10, includes a sealed housing 12 that surrounds a low-Curie-temperature ferrofluid 15 and a transformer 17 immersed therein. Transformer 17 includes a core of laminated sheets 19, on which are wound primary and secondary windings 21*a*, 21*b*. Transformer 17 produces a leakage magnetic field, illustrated by broken lines and denoted generally by reference numeral 25, which draws cool ferrofluid toward transformer 17 to replace hot fluid that has risen away from transformer 17.

Figure 2:
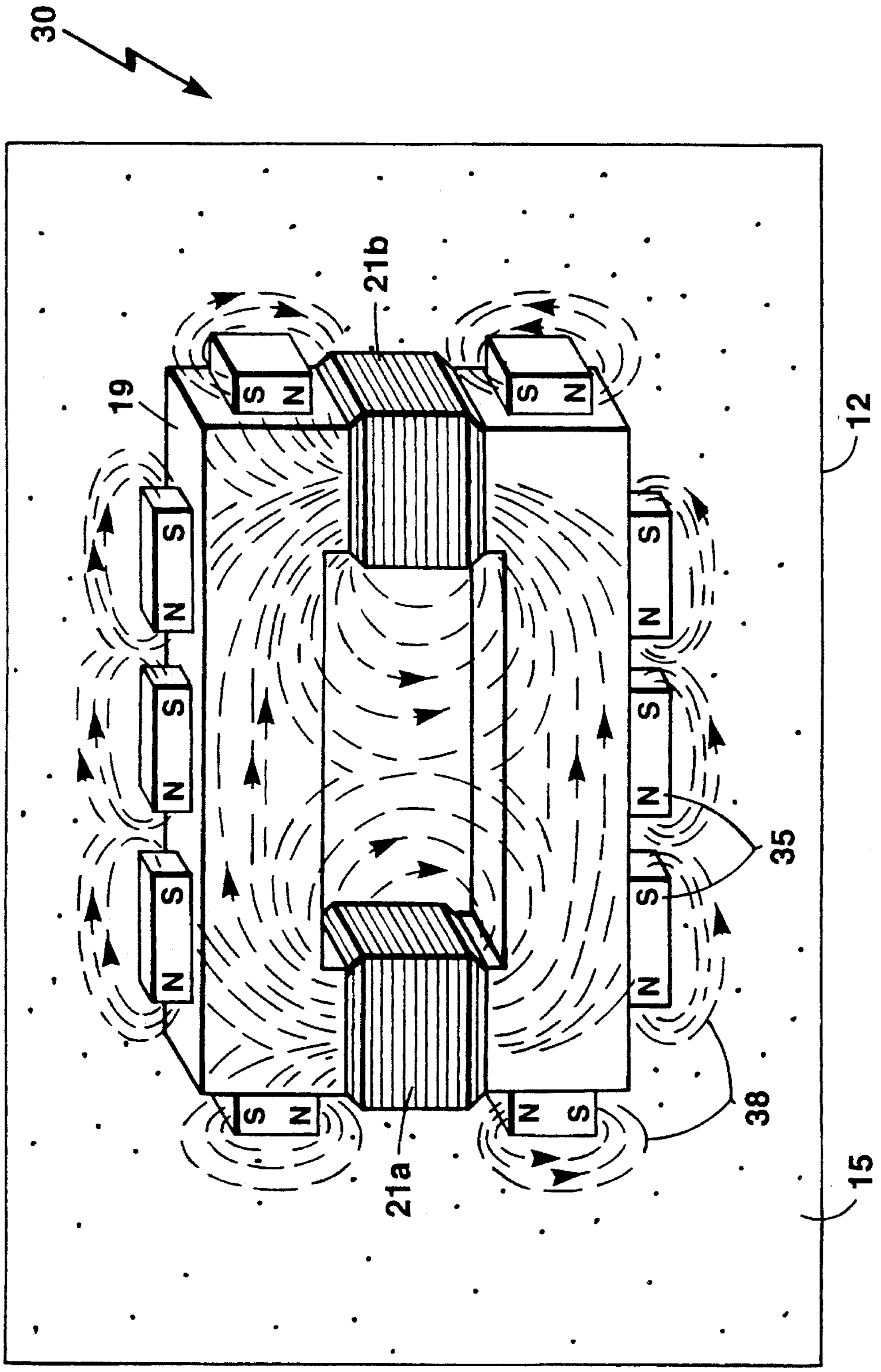
FIG. 2 is a schematic illustration a transformer lacking a leakage field, which has been adapted for use with the present invention.

In some cases, an inductor device will not produce a sufficiently strong magnetic leakage field to adequately circulate the ferrofluid. Such a device, denoted generally by reference numeral 30, is shown in FIG. 2. The device 30 is a transformer assembly, similar in structure to that illustrated in FIG. 1, but lacking the strong leakage field 25. To enhance the field, a series of auxiliary permanent magnets 35 are distributed around core 19, and produce their own magnetic fields 38. Auxiliary magnets 35 are oriented such that their fields 38 enhance the field produced by transformer 19, resulting not only in greater ferrofluid attraction but also improved transformer performance.

It will therefore be seen that we have developed a highly versatile system for cooling electromagnetic devices, particularly transformers, that generate both heat and magnetic leakage fields. The terms and expressions employed herein are used as terms of description and not of limitation, and there is no intention, in the use of such terms and expressions, of excluding any equivalents of the features shown and described or portions thereof, but it is recognized that various modifications are possible within the scope of the invention claimed.

What is claimed is:

1. A convection-cooled electromagnetic device comprising:

a. a container having a wall;

b. within the container, an electromagnetic device producing an external magnetic field and having a maximum operating temperature; and c. a ferrofluid surrounding the device and in contact with the wall, the ferrofluid comprising:

i. a substantially ion-free, thermally stable oil carrier having a dielectric constant below 4 and an intrinsic resistivity exceeding $10^7$ ohm-meters; and ii. dispersed therein, a sufficient concentration of magnetic particles to produce a bulk ferrofluid saturation magnetization of at least 50 Gauss, the particles exhibiting a Curie temperature of no more than 300° C.

2. The device of claim 1 wherein the ferrofluid further comprises a surfactant.

3. The device of claim 2 wherein the surfactant is anionic, cationic or nonionic.

4. The device of claim 1 wherein the carrier is selected from the group consisting of petroleum, synthetic hydrocarbons, silahydrocarbons, perfluoropolyethers, chlorofluorocarbons and silicone.

5. The device of claim 1 wherein the ferrofluid exhibits a viscosity not greater than 500 centipoises at 27° C.

6. The device of claim 5 wherein the ferrofluid exhibits a viscosity of at least 10 centipoises at 27° C.

7. The device of claim 1 wherein the bulk ferrofluid magnetization is no greater than 600 Gauss.

8. The device of claim 1 wherein the particles have an average diameter of at least 50 Å.

9. The device of claim 1 wherein the particles have an average diameter no greater than 200 Å.

10. The device of claim 1 wherein the particles have an average diameter of 100 Å.

11. The device of claim 1 wherein the Curie temperature of the particles exceeds the average operating temperature of the electromagnetic device, and the ferrofluid loses substantial magnetization at the average operating temperature.

12. The device of claim 1 wherein the device has a maximum operating temperature, and the Curie temperature of the particles exceeds the maximum operating temperature of the electromagnetic device, and the ferrofluid loses magnetization at the maximum operating temperature.

13. The device of claim 1 wherein the particles are selected from the group consisting of ferrites, orthoferrites and rare-earth garnets.

14. The device of claim 1 wherein the particles comprise $Mn_{0.5}Zn_{0.5}OFe_2O_3$.

15. The device of claim 1 wherein the particles comprise $Ni_{0.3}Zn_{0.7}OFe_2O_3$.

16. The device of claim 1 wherein the particles comprise $Ni_{0.2}Zn_{0.6}Fe_{2.2}O_4$.

17. The device of claim 1 wherein the particles comprise $Zn_{0.6}CO_{0.5}Fe_{1.9}O_4$.

18. The device of claim 1 wherein the particles comprise $Mg_{0.5}Zn_{0.5}OFe_2O_3$.

19. The device of claim 1 wherein the particles comprise $MnFe_2O_4$.

20. The device of claim 1 wherein the particles comprise $Mn_{0.65}Zn_{0.35}OFe_2O_3$.

21. The device of claim 1 wherein a leakage field is produced by auxiliary permanent magnets having associated magnetic fields and which are affixed to the electromagnetic device.

22. The device of claim 21 wherein the device is a transformer having an associated magnetic field, and the permanent magnets are oriented such that their fields enhance the magnetic field of the transformer.

23. A method of cooling an electromagnetic device producing an external magnetic field, the method comprising the step of surrounding the device with a ferrofluid comprising:

a. a substantially ion-free, thermally stable oil carrier having a dielectric constant below 4 and an intrinsic resistivity exceeding $10^7$ ohm-meters; and b. dispersed therein, a sufficient concentration of magnetic particles to produce a bulk ferrofluid saturation magnetization of at least 50 Gauss, the particles exhibiting a Curie temperature of no more than 300° C.

24. A method of improving the performance of a high-power transformer comprising a core immersed in an oil carrier and surrounded by a housing, the method comprising the step of adding to the oil a sufficient concentration of magnetic particles to produce a bulk ferrofluid with a saturation magnetization of at least 50 Gauss, the particles exhibiting a Curie temperature of no more than 300° C.

* * * * *